United States Patent
Vaxman et al.

(10) Patent No.: US 12,412,789 B2
(45) Date of Patent: Sep. 9, 2025

(54) ENDPOINT OPTIMIZATION FOR SEMICONDUCTOR PROCESSES

(71) Applicant: Applied Materials, Inc., Santa Clara, CA (US)

(72) Inventors: Avishay Vaxman, Albany, NY (US); Qintao Zhang, Mount Kisco, NY (US); Jeffrey P. Koch, Austin, TX (US); David P. Surdock, Kalispell, MT (US); Wayne R. Swart, Tivoli, NY (US); David J. Lee, Poughkeepsie, NY (US); Samphy Hong, Saratoga Springs, NY (US); Aldrin Bernard Vincent Eddy, Clifton Park, NY (US); Daniel G. Deyo, West Hurley, NY (US)

(73) Assignee: Applied Materials, Inc., Santa Clara, CA (US)

( * ) Notice: Subject to any disclaimer, the term of this patent is extended or adjusted under 35 U.S.C. 154(b) by 522 days.

(21) Appl. No.: 17/966,634

(22) Filed: Oct. 14, 2022

(65) Prior Publication Data
US 2024/0128131 A1    Apr. 18, 2024

(51) Int. Cl.
| | |
|---|---|
| *H01L 21/66* | (2006.01) |
| *G06T 7/00* | (2017.01) |
| *G06T 7/80* | (2017.01) |
| *H04N 5/225* | (2006.01) |
| *H04N 5/232* | (2006.01) |
| *H04N 23/56* | (2023.01) |
| *H04N 23/60* | (2023.01) |
| *H04N 23/80* | (2023.01) |

(52) U.S. Cl.
CPC ............. *H01L 22/24* (2013.01); *G06T 7/001* (2013.01); *G06T 7/80* (2017.01); *H01L 22/26* (2013.01); *H04N 23/56* (2023.01); *H04N 23/64* (2023.01); *H04N 23/80* (2023.01); *G06T 2207/30148* (2013.01)

(58) Field of Classification Search
CPC . H01L 22/24; H01L 22/26; G06T 7/80; G06T 7/001; G06T 2207/30148; H04N 23/80; H04N 23/56; H04N 23/64
See application file for complete search history.

(56) References Cited

U.S. PATENT DOCUMENTS

2003/0218688 A1* 11/2003 Shaw ...................... H04N 23/74
348/370

\* cited by examiner

*Primary Examiner* — Jamil Ahmed
(74) *Attorney, Agent, or Firm* — Kilpatrick Townsend & Stockton LLP

(57) ABSTRACT

A camera may capture reflected light from the surface of the wafer during a semiconductor process that adds or removes material from the wafer, such as an etch process. To accurately determine an endpoint for the process, a camera sampling rate and light source intensity may be optimized in the process recipe. Optimizing the light source intensity may include characterizing light intensities that will be reflected from the waiver using an image of the wafer. Pixel intensities may be used to adjust the light source intensity to compensate for more complex wafer patterns. Optimizing the camera sampling rates may include nondestructively rotating a view of the wafer and converting the sampled intensities to the frequency domain. The camera sampling rate may be increased or decreased to remove spatial noise from the image without oversampling unnecessarily. These optimized parameters may then generate a clean, repeatable trace for endpoint determination.

20 Claims, 10 Drawing Sheets

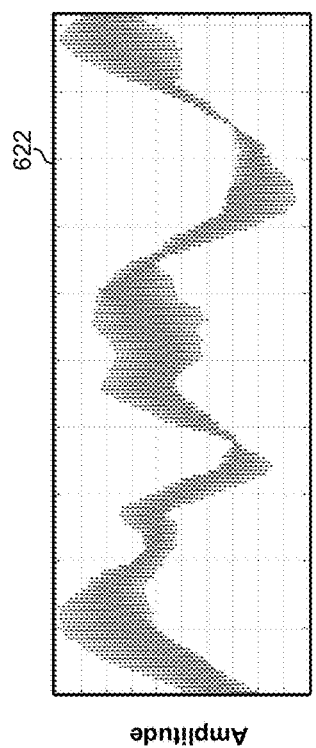
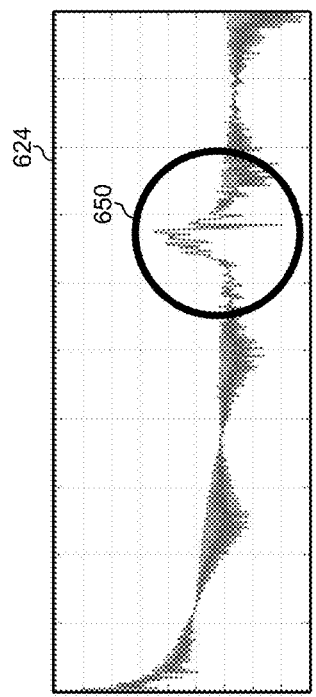
FIG. 6A
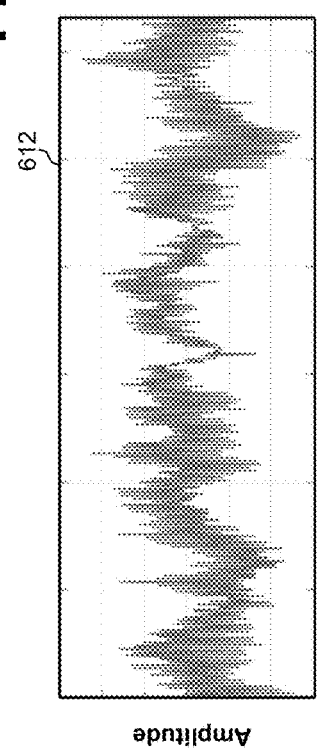
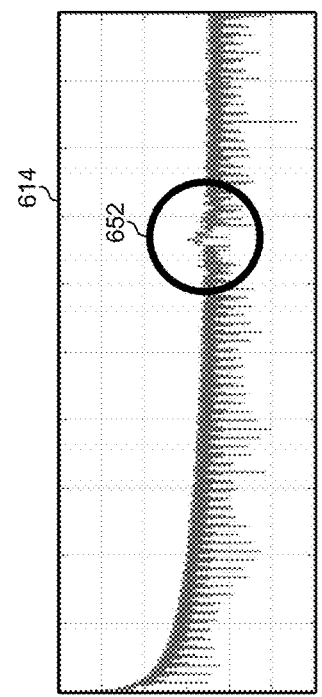
FIG. 6B
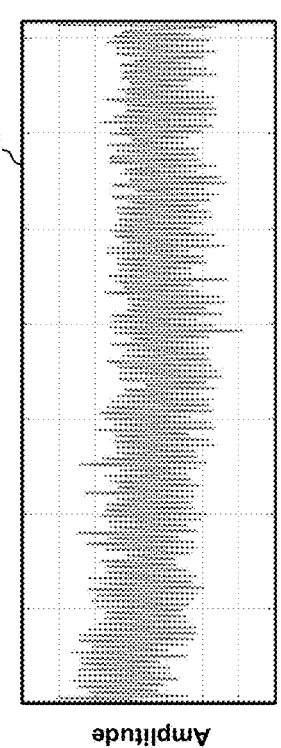
FIG. 6C

ENDPOINT OPTIMIZATION FOR SEMICONDUCTOR PROCESSES

TECHNICAL FIELD

This disclosure generally describes determining an endpoint for semiconductor processes. More specifically, this disclosure describes the optimization of a camera sampling rate and a light source intensity used during the semiconductor process to improve the endpoint determination.

BACKGROUND

Many semiconductor processes add or removed material on the surface of the wafer. For example, a wet etch process submerges the wafer in a liquid etchant to remove a layer of material. The wafer may be rotated in the agitated liquid as the liquid removes the material over time. The amount of material removed may be a function of the time in which the wafer is submerged in the processing chamber. Similarly, deposition processes may expose a wafer to deposition gases, ions, and/or plasmas to deposit a material on the surface of the wafer. The amount of material added may also be a function of time in which the wafer is subjected to this chamber environment. In each of these processes, the wafer may be monitored using a monitoring system to identify when a sufficient amount of material has been removed or added. Data from the monitoring system may be used to determine when an endpoint for the process has been reached. Therefore, accurately forming or removing material to a specific depth on the surface of the wafer depends on accurate endpoint calculations.

SUMMARY

In some embodiments, a method of optimizing light sources used to monitor semiconductor processes may include receiving an image of a wafer; determining, based on the image of the wafer, a characterization of intensities of light that will be reflected from the wafer during a semiconductor process; and determining, based on characterizing the intensity of the light, an intensity of a light source to be directed at the wafer during a semiconductor process.

In some embodiments, a method of optimizing camera sampling rates used to monitor semiconductor processes may include receiving a time sequence of light intensity measurements from a view of a wafer being rotated; converting the time sequence of light intensity measurements into a frequency domain signal; determining whether a distortion signal is present in the frequency domain signal; and determining a camera sampling rate based on whether the distortion signal is present in the frequency domain signal.

In some embodiments, a method of determining endpoints for semiconductor processes may include determining, based on an image of a wafer, an intensity of a light source to be directed at the wafer during a semiconductor process; determining a camera sampling rate based on distortion in a frequency domain representation of a first time sequence of light intensity measurements from a view of the wafer while being rotated; performing the semiconductor process on the wafer and recording a second time sequence of light intensity measurements from the wafer during an actual execution of the semiconductor process on the wafer; determining an endpoint for the semiconductor process based on the second time sequence of light intensity measurements; and causing the endpoint to be stored in a recipe for processing the wafer.

In any embodiments, any and all of the following features may be implemented in any combination and without limitation. The image of the wafer may include an image captured outside of a semiconductor processing chamber while the wafer is still and before the wafer is subjected to an etch process. The image of the wafer may include a grayscale image, and pixel values in the grayscale image may characterize intensities of light that will be reflected from corresponding locations on the wafer during the semiconductor process. The method may also include storing the intensity of the light source as a recipe parameter for the semiconductor process, and executing the semiconductor process on the wafer using the recipe parameter to control the intensity of the light source during the semiconductor process. The image of the wafer may include an image captured inside of a semiconductor processing chamber while the wafer is rotated and before the wafer is subjected to an etch process. Determining the characterization of the intensities of light may include providing the image of the wafer or the characterization of intensities of light as an input to a model. Determining the intensity of the light source to be directed at the wafer during a semiconductor process may include receiving an output from the model used to determine the intensity of the light source. The characterization of intensities of light may include a histogram of pixel values in the image of the wafer. Determining the intensity of the light source to be directed at the wafer during a semiconductor process may include iteratively increasing or decreasing pixel values in the image of the wafer corresponding to an increase or decrease in the intensity of the light source until the characterization of the intensities of light that will be reflected is in a range that will produce a clean and repeatable trace. The view of the wafer may include a camera view of the wafer as the wafer is rotated in a semiconductor processing chamber while the wafer before the wafer is subjected to an etch process. The view of the wafer may include a virtual rotation of an image of the wafer. Determining the camera sampling rate based on whether the distortion signal is present in the frequency domain signal may include determining that the distortion signal is present in the frequency domain signal; and increasing the camera sampling rate relative to a camera sampling rate used to capture the time sequence of light intensity measurements. The method/operations may also include iteratively increasing the camera sampling rate, and receiving a new time sequence of light intensity measurements after increasing the sampling rate until the distortion signal is no longer present in the frequency domain signal. Determining the camera sampling rate based on whether the distortion signal is present in the frequency domain signal may include determining that the distortion signal is not present in the frequency domain signal; and decreasing the camera sampling rate relative to a camera sampling rate used to capture the time sequence of light intensity measurements. The method/operations may also include iteratively decreasing the camera sampling rate, and receiving a new time sequence of light intensity measurements after decreasing the sampling rate until the distortion signal is present in the frequency domain signal, then increasing the sampling rate enough to remove the distortion signal. The second time sequence of light intensity measurements for the etch process may be sufficient to generate the endpoint as a repeatable trace without requiring destruction of more than one wafer.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIGS. 6A-6C illustrate how a camera sampling rate may be optimized, according to some embodiments.

DETAILED DESCRIPTION

A camera may capture reflected light from the surface of the wafer during a semiconductor process that adds or removes material from the wafer, such as an etch process. To accurately determine an endpoint for the process, a camera sampling rate and light source intensity may be optimized in the process recipe. Optimizing the light source intensity may include characterizing light intensities that will be reflected from the waiver using an image of the wafer. Pixel intensities may be used to adjust the light source intensity to compensate for more complex wafer patterns. Optimizing the camera sampling rates may include nondestructively rotating a view of the wafer and converting the sampled intensities to the frequency domain. The camera sampling rate may be increased or decreased to remove spatial noise from the image without oversampling unnecessarily. These optimized parameters may then generate a clean, repeatable trace for endpoint determination.

Figure 1:
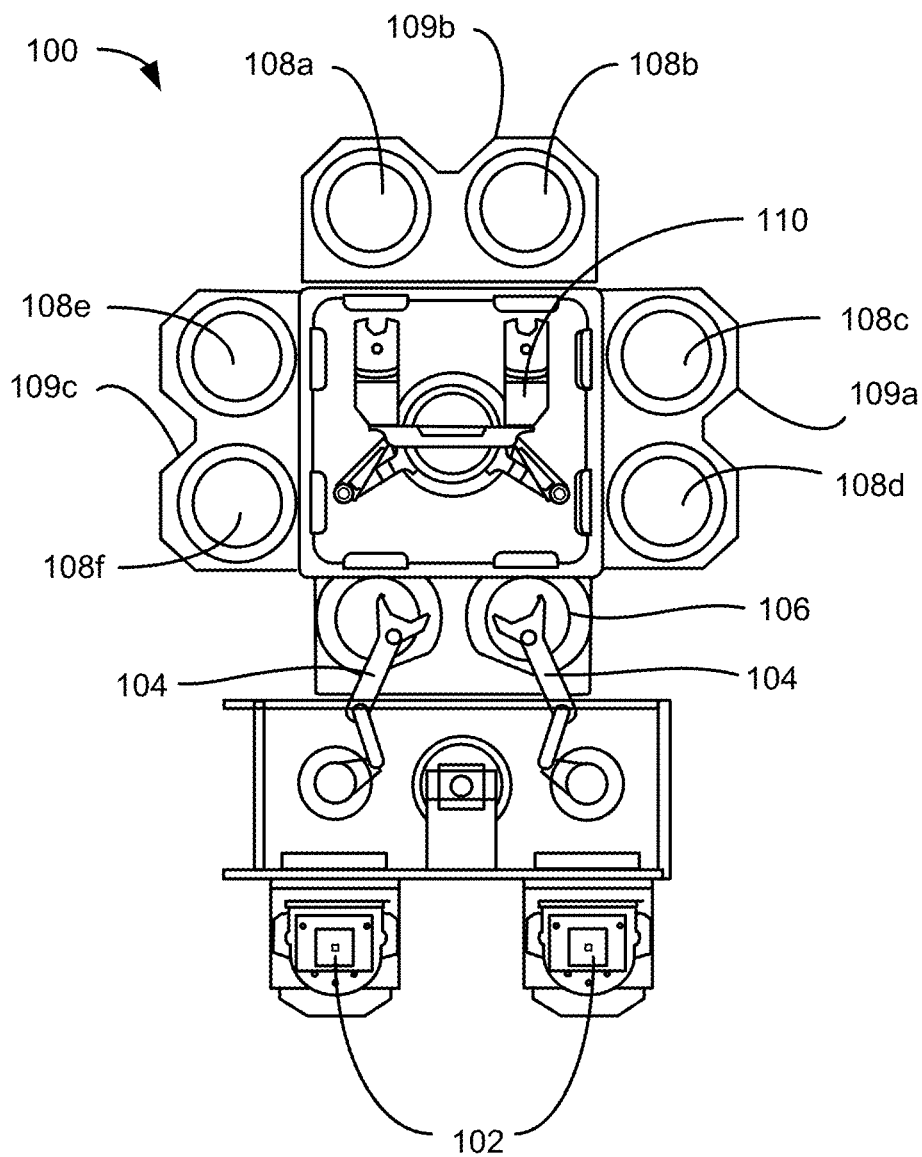
FIG. 1 illustrates a top plan view of one embodiment of a processing system 100 various processing chambers according to some embodiments.

FIG. 1 illustrates a top plan view of one embodiment of a processing system 100 of deposition, etching, baking, and curing chambers according to some embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes, wet etch processes, cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by the processing system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

The processing system 100, or more specifically chambers incorporated into the processing system 100 or other processing systems, may be used to produce structures according to some embodiments of the present technology. For example, the processing system 100 may be used to produce memory arrays by performing operations such as deposition, etch, sputtering, polishing, cleaning, and so forth, in the various substrate processing chambers 108.

Semiconductor processing chambers may be used to perform a wide range of processes on semiconductor wafers. This may include processes that either add or remove layers of material to a surface of the wafer. For example, deposition processes may deposit or grow material on the surface of the wafer, while etch processes may be used to remove material from the wafer. A common concern among these processes that add or remove material on a wafer is determining how long the process should be executed. Typically, the longer the process, the more material is added to or removed from the wafer. In some processes, the condition of the wafer and/or the environment inside the processing chamber may be monitored during the process, and these measurements may be used to determine when the desired amount of material has been added to or removed from the wafer. This process of monitoring the conditions of the wafer or the chamber in real-time during the process to identify when enough material has been added to or removed from the wafer may be referred to herein as an endpoint calculation. This disclosure describes methods of determining an endpoint for a semiconductor process.

The endpoint determination method described below may be applied to any semiconductor process. By way of example, a wet etch process may be used below as a semiconductor process that may utilize these endpoint calculations. However, it should be understood that these methods for determining an endpoint of the process may be applied to any semiconductor process that adds or removes material on a wafer. For example, these methods may also be used in dry etch processes, reactive-ion etching, deposition processes, electroplating processes, and/or any other similar semiconductor process.

A wet etch is a process that uses liquid etchants to remove material from the surface of the wafer. The wafer may be immersed in a bath of etchant to remove material from the wafer. For example, hydrochloric acid is commonly used to etch silicon dioxide over a silicon substrate. In order to uniformly remove material from the wafer, the wafer itself may be rotated in the liquid bath, and the liquid may be agitated to ensure that the etchant is continuously circulating on the surface of the wafer. Many different semiconductor processing chambers are commercially available capable of performing a wet etch, such as the Raider® system from Applied Materials®.

After submerging the wafer in the liquid in the etch chamber, the surface of the wafer may be continuously monitored to determine when the desired amount of material has been removed from the wafer. For example, some semiconductor processing chambers may include a light source in the processing chamber (e.g., a light bulb, a laser, etc.) that is directed towards the surface of the wafer during the etch process. Light from the light source may be reflected off the surface of the wafer and captured by a camera that is also present in the processing chamber. The camera may be configured to capture specific wavelengths that are reflected from the surface of the wafer. Any type of camera may be used (e.g., a CCD camera, etc.), and the camera may include a filter that capture specific wavelengths reflected off the surface of the wafer.

The camera may continuously capture images of the wafer as it rotates in the agitated liquid bath. These images or measurements from the camera may be processed in real time in order to determine when an endpoint has been reached by the process. Various algorithms may be used to process the time sequence of images from the camera. For example, the image data from the camera may represent a time sequence of light intensity measurements from a view of the wafer being rotated. At the beginning of the process, the light intensity may be relatively high as it is reflected off of a surface material being etched from the wafer. However, as the process continues the light intensity may decrease as the surface material is etched away to expose an underlying layer of material with a different reflectivity. The endpoint algorithm may monitor the intensity of the reflected light captured by the camera to determine when a threshold has been crossed.

Figure 2:
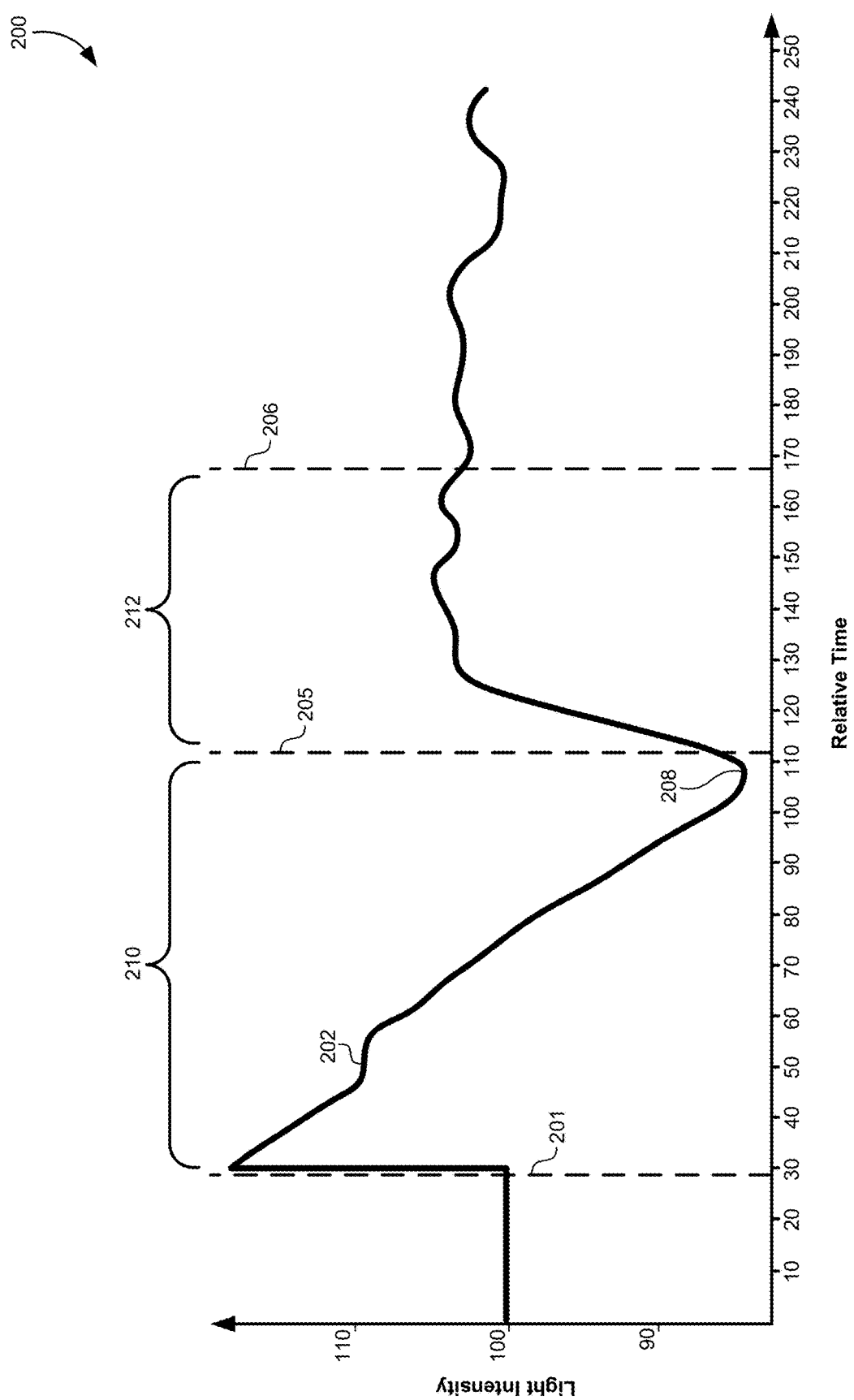
FIG. 2 illustrates a time sequence of light intensity measurements during a semiconductor process, according to some embodiments.

FIG. 2 illustrates a time sequence of light intensity measurements during a semiconductor process, according to some embodiments. The process may include an etch process, and the process may begin at time 201, at which point the monitoring system may begin monitoring the surface condition of the wafer by collecting reflected light from the surface of the wafer. The monitoring system may include at least a camera and a light source. The wafer may be submerged in the liquid, and thus the camera may collect light that is reflected off the wafer after being transmitted through the liquid. The monitoring system may include a processor that records a light intensity measurement or intensity value for each time step. The trace 202 illustrated in FIG. 2 represents a graph of the light intensity measurements as a function of time.

As the etch process is carried out during the interval 210, the material may be gradually removed from the surface of the wafer. As the material is removed, the intensity of light reflected off the surface of the wafer and received by the camera may gradually change, decreasing in this specific case, as illustrated in FIG. 2. For example, a layer of copper may be present on the surface of the wafer to reflect light collected by the camera. As the copper is etched away, the intensity of the light reflected from the copper may decrease. Note that some embodiments may be configured to etch multiple layers sequentially. For example, a copper layer may first be etched, followed by a titanium layer. Any materials may be used in the various layers besides copper and titanium, so these layers may be differentiated from each other by referring to these layers generically as a first layer, a second layer, and so forth.

When the top, or first, layer of material is removed, the intensity of the light may reach a stable value, in this specific case a minimum value 208. This minimum value 208 may indicate that the first layer of material has been completely removed at time 205. After the minimum value 208 is reached, the light intensity may begin reflecting fully off the second layer of material. In order to ensure that all the remnants of the first layer material have been removed, the wafer may be left in the liquid during the interval 212, referred to as an "over-etch interval." Because the etchants used to remove each layer material may be very selective to those materials, the over-etch interval 212 may not significantly remove the underlying layer. At or before time 206, the wafer may be removed from the etchant liquid and rinsed to end the etch process for that particular layer.

As can be seen in FIG. 2, processes may benefit from accurate determination of the endpoint for the processes. For example, the more accurately it may be determined when a layer of material is completely removed from the wafer, the faster the etch process may be completed, and the overall throughput of the process for a batch of wafers may be increased. Accurately calculating the endpoint and optimizing the time spent in the etch chamber may also reduce wasted liquid etchant and other materials used in the process since these liquids are continuously circulated through the chamber. Since the live monitoring of the process is performed by the monitoring system, accurate endpoint calculation may rely heavily on the accuracy of the light intensity data collected by the monitoring system. Specifically, the camera sample rate and the light intensity output of the light source represent two recipe parameters that may be adjusted to optimize the quality of the trace 202 used for endpoint calculation.

Figure 3:
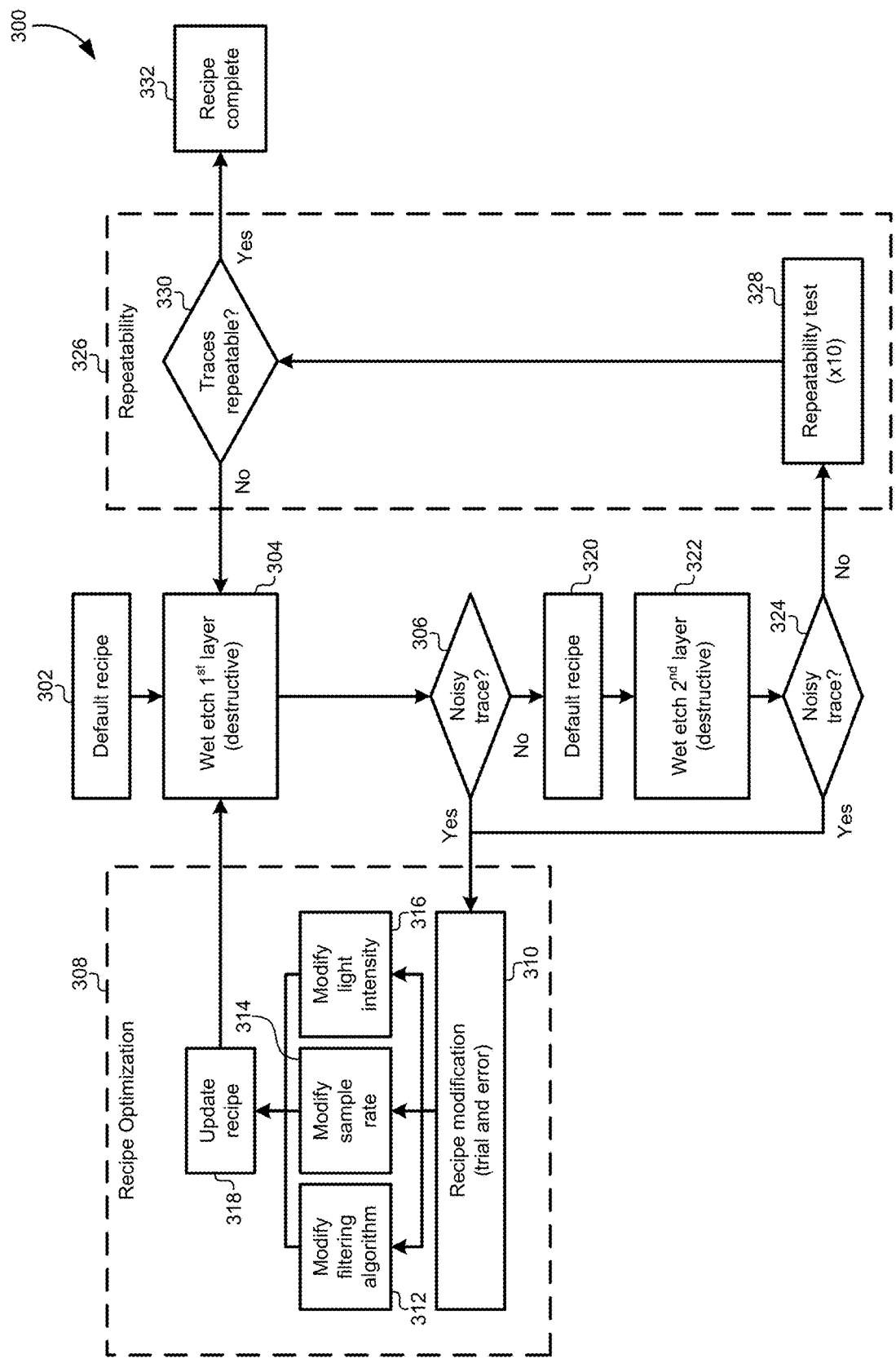
FIG. 3 illustrates a flowchart of a method of determining an intensity for the light source and a sample rate for the camera, according to some embodiments.

FIG. 3 illustrates a flowchart 300 of a method of determining an intensity for the light source and a sample rate for the camera, according to some embodiments. The light intensity and the sample rate of the camera may need to be adjusted for each wafer design in order to actually monitor different wafer patterns. Because the material patterns on each wafer design are different, the light reflected from the surface of this material may be different for each design. For example, very dense or complicated patterns on the wafer may reflect less light when compared to patterns that have large open areas (e.g., large areas of a material such as copper that reflect light uniformly as the wafer spins). Therefore, the intensity of the reflected light may be very different for different wafer patterns. When a more complex wafer pattern is used with a high feature density, the intensity of the light directed onto the surface of the wafer may need to be increased, since the material on the wafer may tend to reflect less of that light into the camera. Thus, each individual wafer pattern may require a corresponding light intensity setting that is specifically tailored for that wafer pattern.

Additionally, each wafer pattern may represent different spatial frequencies as the wafer is rotated in front of the camera. The camera may be directed at a location on the wafer as the wafer spins, thereby capturing a sequence of light measurements reflected off the wafer at a given radius during rotation. High feature densities and complex patterns may require higher sample rates by the camera as the wafer is rotated. If the camera sample rate is too slow, spatial noise may be introduced into the light intensity measurements that prevent the monitoring system from reading a clean and continuous trace of light intensity measurements in contrast to the trace 202 in FIG. 2. Therefore, each individual wafer pattern may require a corresponding camera sampling rate (also referred to as a capture rate) to remove spatial noise from the intensity measurements.

Flowchart 300 in FIG. 3 illustrates an iterative process for determining a light intensity setting and a camera sampling rate for a particular wafer design. For each new wafer design, a default recipe may be used as a starting point (302). In order to evaluate how the default recipe performs, a wet etch process may be performed on a first layer of material in a semiconductor etch chamber to remove the first layer of material (304). As described above, the camera may continuously capture a time sequence of light intensity measurements from the camera's view of the wafer as it is rotated in the etchant liquid. After the etch process is complete, the trace generated by this time sequence of light intensity measurements may be evaluated. If the trace is noisy (306), then a recipe optimization algorithm (308) may be executed. A trace may be characterized as "noisy" if the noise level in the trace exceeds a threshold amount. For example, the standard deviation of the normalized time sequence light intensity measurements during the sample time may be compared to a threshold.

The recipe optimization algorithm (308) may include a trial and error recipe modification technique (310) where a filtering algorithm may be modified (312), the sampling rate of the camera may be modified (314), and/or the light intensity of the light source may be modified (316). Incremental adjustments may be made to one or more of these different parameters to create an updated recipe (318). The updated recipe may then be provided back to the etch chamber, and another wafer may be etched in the chamber using the updated recipe (304). This process may be repeated until the trace is no longer considered noisy (306). This process may then be repeated for a second layer on the wafer, again using the default recipe (320) to perform a second wet etch process on the second layer (322). The resulting trace for the second layer may then be analyzed, and if this trace is noisy (324), the recipe optimization algorithm (308) may be executed for the recipe used on the second material.

After sufficiently clean traces have been produced for each of the material layers, a repeatability algorithm (326) may be executed to ensure that the traces are repeatable between different wafers. A repeatability test may be executed on a plurality of wafers (328). For example, the repeatability test may perform a wet etch on 10 different wafers and compare the resulting traces to determine whether they are sufficiently similar. If the traces vary by more than a threshold amount, the process may be repeated, optimizing the recipe again to adjust the camera sampling rate, the light intensity of the light source, etc., until the traces are repeatable (330). Once a recipe is derived that produces a clean, repeatable trace, the recipe may be considered complete and ready for processing a batch of wafers (332).

This process described in FIG. 3 is considerably costly. For example, each stage of this process may require a destructive wet etch executed on as many as 10 or more semiconductor wafers. In order to reach an accurate end point recipe, this process being require a considerable amount of time, often exceeding 10 hours of processing and iteration. To solve these and other technical problems, the embodiments described herein use a much faster and less destructive method for optimizing the sample rate of the camera and the light intensity setting for the light source.

Figure 4:
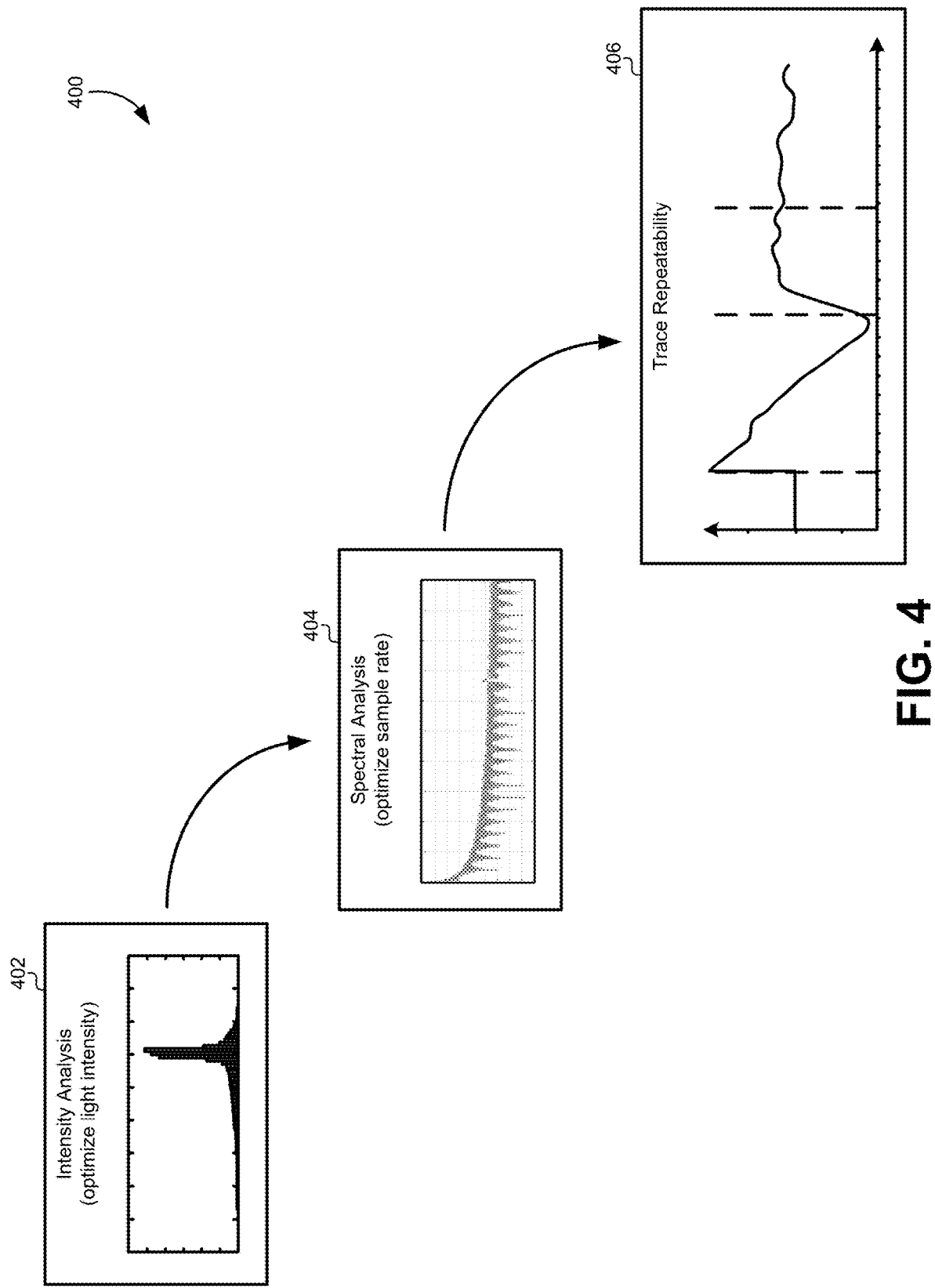
FIG. 4 illustrates a flowchart of an improved method for determining an endpoint recipe for a wafer, according to some embodiments.

FIG. 4 illustrates a flowchart 400 of an improved method for determining an endpoint recipe for a wafer, according to some embodiments. The process illustrated in flowchart 400 may be compared to the process illustrated in flowchart 300 above. Specifically, the method of flowchart 300 requires an iterative process that destructively etches multiple wafers and requires multiple hours of processing time in order to incrementally dial-in the intensity of the light source and/or the camera sampling rate. In contrast, the method of flowchart 400 virtualizes these steps, thereby reducing the number of physical process iterations and greatly reducing the number of wafers that are destructively etched before the recipe is optimized. In short, the method of flowchart 400 represents a technical improvement in the etch process for a specific wafer by improving the performance of the endpoint calculation algorithm, and also represents a technical improvement for processing a batch of wafers by eliminating waste and increasing the overall throughput.

Instead of iterating through multiple trial-and-error adjustments to the light intensity setting of the light source, the method may include an image-based step for determining the intensity of the light source that will be directed at the wafer during the etch process (402). Instead of performing a full wet etch on the wafer, this process may use an image of the wafer to analyze the reflectivity of the wafer based on the wafer pattern. For example, a computer system may receive an image of the wafer. The image may be a captured camera image of the wafer either inside or outside of the chamber environment. This image may be analyzed to characterize the intensities of light that will be reflected from the wafer during the etch process. Based on the characterization of the light intensity, the intensity of the light source may be adjusted to improve the image quality captured by the camera during the etch process. For example, if the pattern on the wafer is very complex and dense, thus resulting in less of a reflective surface, the intensity of the light source may be increased to improve the image quality.

The method may also include performing a spectral analysis to determine a camera sampling rate (404). The sampling rate may be based on identifying a distortion in a frequency domain representation of the time sequence of light intensity measurements from the view of the wafer while the wafer is rotated. For example, a wafer may be inserted into the processing chamber without the liquid etchant. The wafer may be rotated, and a time sequence of light intensity measurements may be captured from the wafer by the camera. This time sequence of light intensity measurements may then be converted into a frequency domain signal. The frequency domain signal may be analyzed to identify a peak frequency signal that may be present in the frequency domain. The camera sampling rate may then be adjusted based on whether or not the peak frequency signal is present. For example, if a distortion signal is present in the frequency domain, the camera sampling rate may be increased.

After optimizing the light source intensity and the camera sampling rate as described above, a single wet etch of an actual wafer may be performed to capture a trace of an actual time sequence of light intensity measurements from the wafer during the wet etch (406). It is been discovered that after optimizing the light source and the camera sampling rate, this single trace will be very repeatable when processing a batch of wafers. Therefore, this single trace may be used by the endpoint algorithm to determine an endpoint for the etch process. This eliminates the waste of repeatedly performing a wet etch on actual wafers to determine whether the trace will be repeatable. Instead, the repeatability may be assumed based on the optimization of the light intensity and camera sampling rate.

Figure 5A:
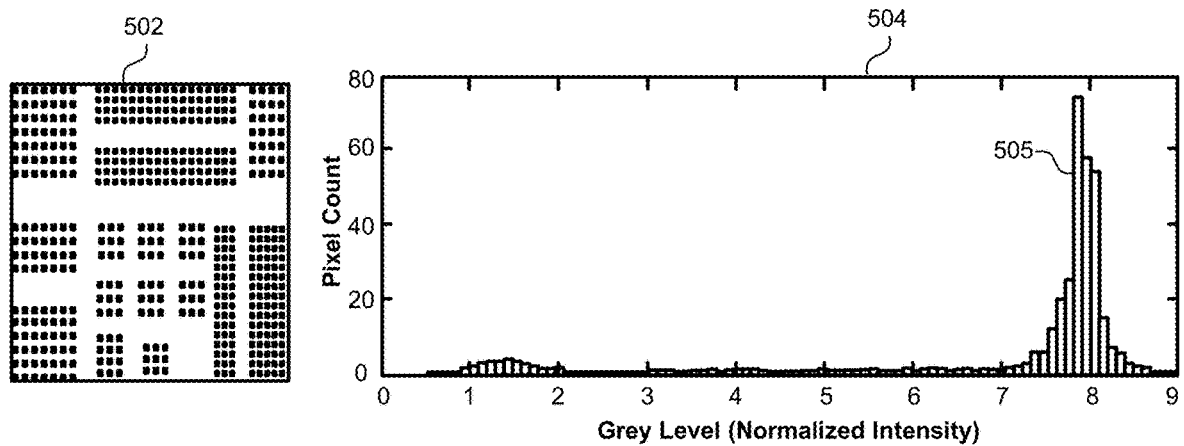
FIGS. 5A-5C illustrate wafer images and characterizations of intensities of light that will be reflected from the wafer during the etch process, according to some embodiments.
Figure 5B:
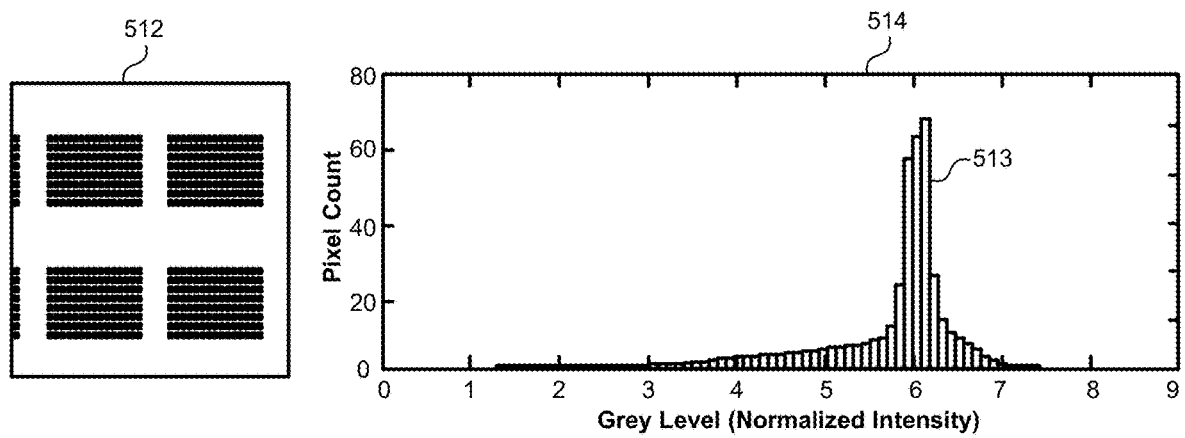
Figure 5C:
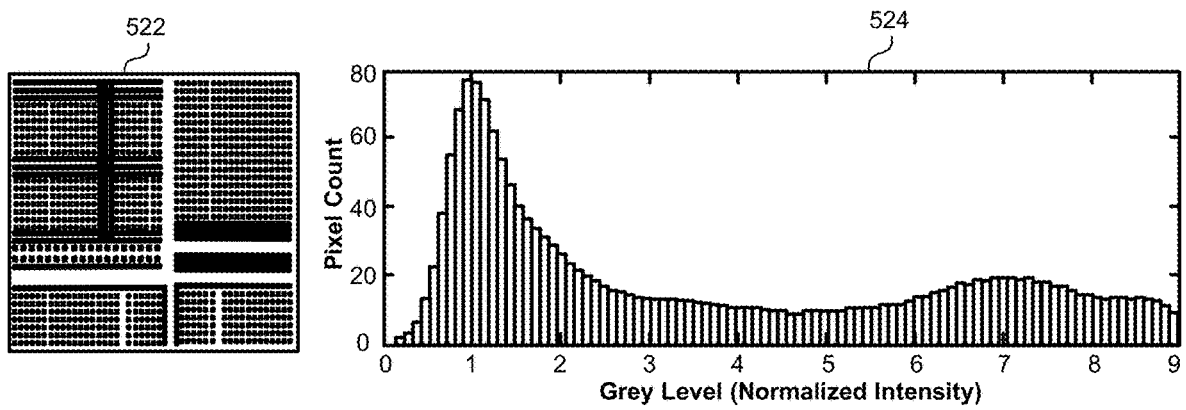

FIGS. 5A-5C illustrate wafer images and characterizations of intensities of light that will be reflected from the wafer during the etch process, according to some embodiments. Ideally, the traces for each wafer during the semiconductor processing should be very similar so that the endpoint calculated by the endpoint algorithm is the same for each wafer. The method in FIG. 3 tends to work with standard layouts where the pattern features in the material layer are relatively small compared to the overall size of the wafer. This results in a large open areas that reflect consistent light intensities back to the camera. However, as the complexity and pattern density of the wafers continue to increase, the reflective areas of the material being etched become more unpredictable, dark, and/or irregular. This results in a smaller reflective area, which reduces the overall light intensity received by the camera. Low light intensities cause the signal-to-noise ratio (SNR) to decrease, resulting in traces that are relatively noisy and not repeatable.

In order to improve the performance of the endpoint algorithm, the light source may be increased for these wafers with complex patterns. For example, increasing the power provided to the light source during the etch process may result in more light being reflected from the surface of the wafer back to the camera of the monitoring system. This increases the intensity of light measured by the camera and increases the SNR of the measured trace. However, care should be taken to avoid increasing the intensity of the light source beyond what is necessary, as increasing the power unnecessarily may reduce the lifetime of the light source. Replacing the light source is both costly in terms of the part itself and in terms of the time the semiconductor processing chamber will be off-line for the replacement to take place. Increasing the intensity of the light source too much may also result in over exposing the wafer and saturating the measurements of the reflected light captured by the camera.

Instead of measuring reflected light during a live etch process, some embodiments may visually analyze the pattern of the material on the wafer to characterize the intensity of light that will be reflected during the live etch process. For example, an image of the wafer may be provided to a computer system to visually analyze the image of the wafer. This image of the wafer may be provided by a customer or may be captured by a camera in the image processing chamber. This image may be captured while the wafer is not moving rather than when the wafer is being rotated continuously. This image may also capture a view of the entire wafer or a view of an area on the wafer that will be captured by the camera in the chamber (e.g., a view at a predetermined radius on the wafer).

The image may be captured while the wafer is dry and before the wafer is immersed in the etchant liquid. Generally, when the light is reflected from the surface of the wafer during the etch process, the liquid may to interfere with the reflected light and degrade the measurements received by the camera to at least some degree (e.g., light scattering in the liquid, the difference between the indices of refraction of the liquid and the chamber environment, etc.). By using a static image of a dry wafer while the wafer is still, a very clear picture of the pattern on the wafer may be analyzed without interference from a liquid between the wafer and the camera and/or light source. In some embodiments, the image of the wafer may be captured by the camera in the semiconductor processing chamber as the wafer is rotated. This may result in an image that captures pixels at a predetermined radius corresponding to the camera location. The image of the wafer may be captured using an optical microscope. The image of the wafer may include an image of the entire wafer, an image of a portion of the wafer, or an image of a single die on the wafer.

Visually analyzing the pattern of the material on the wafer may include analyzing individual pixel values in the image. In some embodiments, a color image may be translated from a color palette (e.g., an RGB palette) to a grayscale image such that each of the pixels represents a numerical value indicating how light or dark the pixel value is in the image. For example, very reflective surfaces (e.g., a large are of a metal layer being removed) may correspond to lighter pixel values in the grayscale image. In contrast, pattern features may correspond to darker values in the grayscale image. Note that conversion to a grayscale image is not required but may simplify processing in some embodiments. Other embodiments may analyze a light intensity of the pixel based on color values rather than grayscale.

In order to characterize the light that will be reflected from the wafer based on the image as a whole, some embodiments may create a histogram or other statistical characterization of the individual pixel values. Each of the "buckets" in the histogram data structure may represent a range of grayscale values. The resulting histogram may then indicate generally how light or dark the image of the wafer is as a whole. For example, FIG. 5A illustrates an image of a wafer 502 with a feature pattern that is relatively sparse and includes large open reflective areas on the surface of the wafer. The resulting histogram 504 indicates a large peak 505 in the grayscale intensity level near the "light" end of the spectrum. Thus, the histogram 504 may represent a characterization of the intensities of light that will be reflected from the wafer during the etch process. Specifically, the statistical distribution of pixel values that are concentrated on the "light" end of the grayscale intensity spectrum may infer that a higher intensity of light will be reflected from the wafer during the etch process.

This characterization of the intensities of light that will be reflected from the wafer may then be used to determine an intensity of the light source to be directed at the wafer during the etch process. For example, the histogram 504 may indicate that a relatively large amount of light will be reflected from the surface of the wafer during the etch. This may correspond to a lower intensity setting for the light source in order to avoid over saturating the images of the wafer captured by the camera. This may also allow the camera to capture quality images while reducing the power required by the light source and improving the overall lifetime of the light source.

A number of different methods may be used to determine the intensity of the light source. In some embodiments, a statistical measure of the pixel values may be calculated and compared to a threshold. For example, a mean or median value of the pixel intensities may be correlated with light source intensity settings using a lookup table. In some embodiments, a peak value may be determined for the pixel values (e.g., peak 505 and FIG. 5A), and that peak value may be correlated with a light intensity setting in a data structure. In some embodiments, a machine-learning model may be trained to receive data associated with the wafer image as an input and generate a light source intensity setting as an output. For example, a machine learning model may receive the pixel values for the image of the wafer 502 as an input. A neural network may be trained to identify patterns of pixel values that correspond to appropriate light source settings. The output of the neural network may include a value that scales the intensity of the light source between a minimum and maximum value (e.g., an output between 0.0 and 1.0). The neural network may be trained using a plurality of wafer images that are labeled with an appropriate light source intensity setting or adjustment.

Some embodiments may utilize an iterative approach to set the intensity of the light source. This iterative approach may be carried out virtually using the image of the wafer 502. For example, if the characterization of the intensities of the light that will be reflected from the wafer (e.g., the histogram 504) indicate that the surface of the wafer will be too reflective as illustrated in FIG. 5A, the image of the wafer 502 may be darkened. For example, each of the pixel values may be scaled down to make the image darker as a whole. This scaling process may be correlated with an amount that the actual light source intensity may also be scaled down in the processing chamber. The process described above may then be carried out again on the darkened image of the wafer 502. A new histogram 504 may be generated, and the statistical characterization of the histogram may be re-analyzed to determine whether the peak 505 as moved to the left enough to avoid oversaturation. Conversely, wafer images that appear too dark may be lightened, which may be translated into an increase in the intensity of the light source output. This process may be iteratively repeated until an optimal value for the light source intensity setting has been identified.

FIG. 5B illustrates an image of a wafer 512 with a balanced distribution of open reflective areas and dense feature patterns. In this example, the image of the wafer 512 produces a histogram 514 where the peak 513 is located closer to a middle region of the light intensity spectrum. This may indicate that a current intensity setting for the light source generates images that will be more likely to produce smooth, repeatable traces for the endpoint determination algorithm. Note that the location of the peak 513 may be the result of a default light setting, or may be derived after increasing/decreasing the grayscale values of the pixels in the image of the wafer 512 using the iterative process described above. Any adjustments made to move the peak 513 towards the middle range of the light intensity spectrum may be translated into corresponding adjustments to the light intensity relative to a starting or default light intensity used in the original image of the wafer 512.

FIG. 5C illustrates an image of a wafer 522 with a relatively complex feature pattern, resulting in very few open reflective areas on the wafer surface. The corresponding histogram 524 generated from the image of the wafer 522 indicates a distribution of pixel values skewed towards the darker end of the grayscale intensity spectrum. This may indicate that using the current light intensity setting for the light source may generate relatively dark images when monitoring the wafer during the etch process, which in turn may lead to noisy traces that complicate the endpoint determination algorithm. However, by increasing the intensity of the light source using the process described above, the peak 523 may be shifted towards the center of the light intensity spectrum. For example, the grayscale distribution of the histogram 524 may be shifted to appear more like the grayscale distribution of the histogram 514 by brightening the image of the wafer 522. A corresponding increase in the intensity setting of the light source may better illuminate the wafer during the etch process and generate cleaner traces for the endpoint determination.

FIGS. 6A-6C illustrate how a camera sampling rate may be optimized, according to some embodiments. As described above, the camera sampling rate may affect the quality of the trace of light intensity values as a function of time used to determine an endpoint for the semiconductor process. Sampling to slowly may introduce a significant amount of spatial noise into the signal. When feature patterns become relatively dense on the wafer, a faster camera sampling rate may be needed to accurately image the wafer. When the sampling rate is too low, the resulting trace may contain a significant amount of noise and my be not be very repeatable. However, it may also be desirable to minimize the camera sampling rate to preserve bandwidth, memory, and processing power. Larger sampling rates result in much larger image files, which take longer to process, more memory to store, and more bandwidth to transmit. Therefore, the embodiments described herein optimize the camera sampling rate such that it is just fast enough to accurately image the wafer without being larger than necessary.

Recall that in the process described in FIG. 3, actual traces were captured by executing the etch process and capturing live camera data. In contrast, some embodiments may instead capture image data without performing the destructive etch process. For example, the wafer may be placed in the semiconductor processing chamber and rotated as it would be rotated during a live semiconductor process. However, the wafer need not be exposed to conditions in the chamber that would add or remove material on the wafer. For example, the wafer may be rotated without submerging the wafer in a liquid etchant. In another example, the wafer may be rotated about exposing the wafer to deposition gases or plasmas, polishing pads and slurries, and other similar materials. As the wafer is rotated, the wafer may be illuminated using the light intensity determined above in FIGS. 5A-5C, and the camera of the monitoring system may capture a time sequence of light intensity measurements.

The time sequence of light intensity measurements from the view of the wafer being rotated will not generate a gradually decreasing trace that would reveal an endpoint as shown in FIG. 2 since no material is actually being removed or added on the wafer. However, light intensity measurements may still be used to optimize the camera sampling rate. In some embodiments, the time sequence of light intensity measurements can be converted into a frequency domain signal. This conversion may use a Fourier transform algorithm, such as the Fast Fourier Transform (FFT). The frequency domain signal may then be used to identify noise frequencies that are introduced as a result of the camera sampling rate being too slow.

FIG. 6A illustrates a graph 622 of a time sequence of light intensity measurements from a view of the wafer being rotated. Very little information regarding the noise introduced by the camera sampling rate or the quality of the resulting trace during a live semiconductor process can be ascertained from the graph 622 in the time domain. However, graph 624 illustrates the resulting frequency domain signal when the time domain signal is converted into the frequency domain. The frequency domain signal reveals a relatively large distortion signal 650 that is present in the sampled image data. The process may determine whether the distortion signal 650 is present in the frequency domain signal in graph 624 by identifying irregularities, or anomalous signal spikes in the frequency domain signal. If the magnitude of the distortion signal 650 is above a threshold amount, the sampling rate of the camera may be increased to remove the distortion signal 650.

An iterative process may be used to optimize the camera sample rate. Instead of repeatedly and destructively etching new wafers in a live semiconductor process, each iteration may be performed using the same wafer. For example, after increasing the camera sample rate in FIG. 6A, the wafer may again be rotated to capture a new time sequence of light intensity measurements from the view of the wafer. This new time sequence of data may be captured at a faster camera rate. FIG. 6B illustrates a graph 612 of the time sequence of light intensity measurements, and the resulting graph 614 of the frequency domain signal. Note that the size of the distortion signal 652 has been reduced in comparison to the distortion signal 650 in graph 624. This may prompt another increase in the camera sampling rate, along with a subsequent iteration of rotating the wafer and capturing a new time sequence of light intensity measurements. FIG. 6C illustrates a third iteration with a graph 602 of the time domain data and a corresponding graph 604 of the frequency domain data. Note that the distortion signal has been mostly eliminated in graph 604. The camera sampling rate used in the final iteration may be used as an optimized value in the recipe settings for the semiconductor process.

The process described above optimizes the camera sampling rate by detecting whether a distortion signal is present in the frequency domain, then decreasing the camera sampling rate until the distortion signal is sufficiently reduced. However, the same process may be carried out in the opposite direction. Recall that it may also be desirable to minimize the camera sampling rate. If the frequency domain data indicates that no distortion signal is present, then the sampling rate of the camera may be reduced for the next iteration. This process may be continued until a sampling rate is identified where the distortion signal becomes sufficiently present in the data. The camera sampling mate may then be increased just above this setting to optimize the result.

In the example described above, the view of the wafer being rotated was captured from a physical wafer being rotated in the semiconductor processing chamber. However, other embodiments may virtualize this process as well. For example, the view of the wafer being rotated may be obtained by rotating the image of the wafer in software. A virtual camera may be used to sample a location on the image of the wafer as it is rotated to generate the time sequence of light intensity measurements. This virtual time sequence may be converted into the frequency domain and analyzed in the same manner as the life camera data was analyzed above.

Using frequency domain data to optimize the camera sampling rate greatly improves the process over previous techniques. First, no wafers need to be destroyed during the process. Second, the time required to load, unload, and perform a complete semiconductor process on the wafer may be eliminated. Instead a single wafer may be rotated repeatedly in the chamber, or an image may be rotated virtually in software. Thus, this frequency domain process eliminates wasted wafers and dramatically improves the speed with which the camera sampling rate can be optimized.

In some chamber configurations, the same camera, controller, and/or monitoring system may be shared between a plurality of processing chambers. For example, two, three, four, etc., etch chambers may share a camera or controller to monitor the progress of their respective etch processes. However, in order to share the camera system, each of these processes may need to use the same camera sampling rate. Therefore, some embodiments may optimize the camera sampling rate for a plurality of different wafer patterns such that these wafer patterns can share the same camera. For example, an optimal camera sampling rate for each pattern may be determined using the process described above. The largest of these optimal camera sampling rates may then be used for the shared camera to ensure that all of the wafer patterns are optimally imaged to generate clean and repeatable traces.

Figure 7:
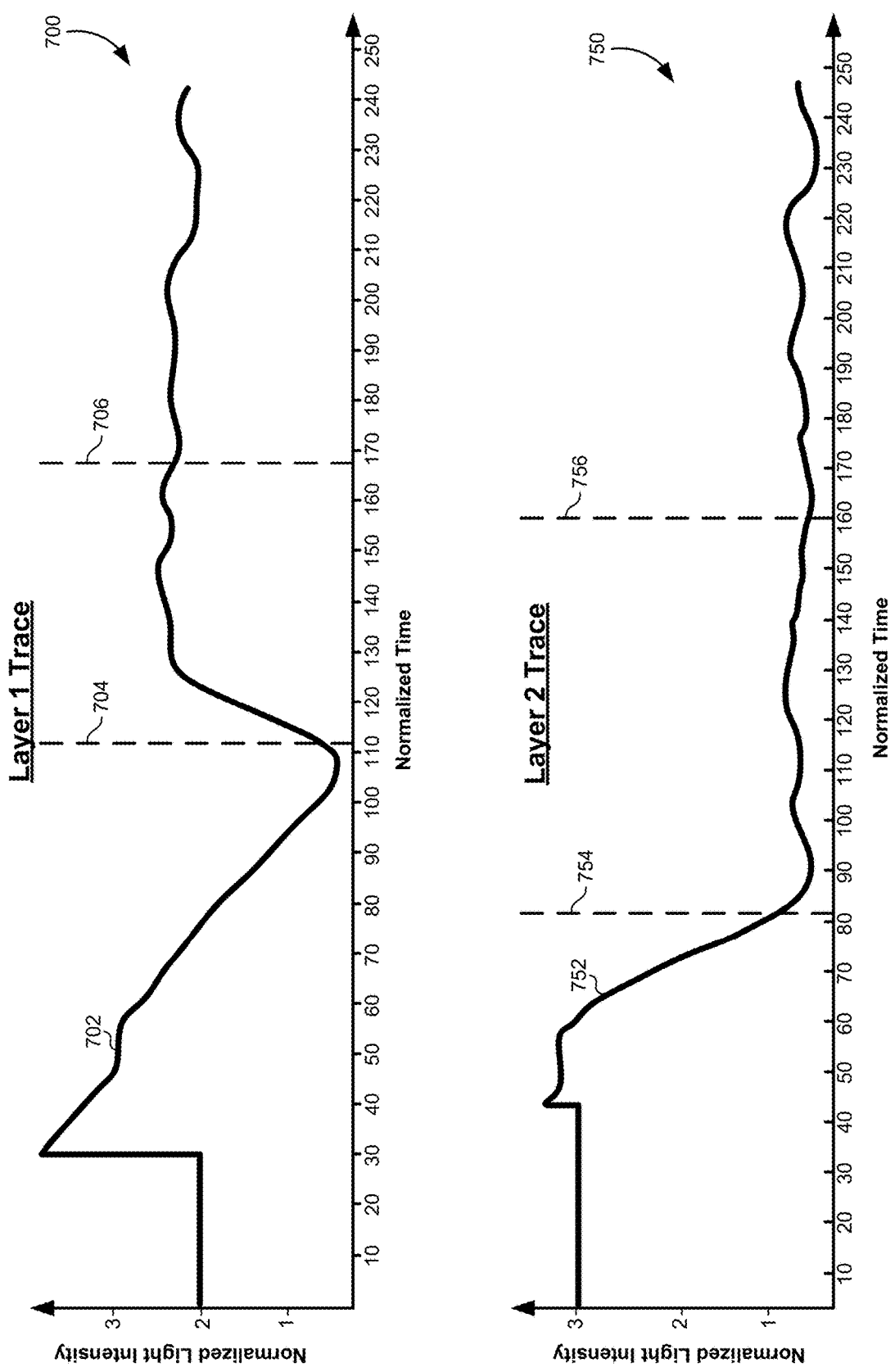
FIG. 7 illustrates traces that may be used for endpoint determination, according to some embodiments.

FIG. 7 illustrates traces that may be used for endpoint determination, according to some embodiments. As described above, multiple layers on the wafer may be processed sequentially. For example, graph 700 illustrates a trace 702 that may be used to etch a first layer of material, such as a copper layer. Graph 750 illustrates a trace 752 that may be used to etch a second layer of material, such as a titanium layer, that may be underneath the first layer. These traces 702, 752 may be captured after the light source intensity and camera sampling rates have been optimize using the processes described above. These traces 702, 752 may be captured using a live semiconductor process, such as a live etch process that removes or adds these material layers. Note that additional layers beyond these two layers may also be subject to the semiconductor process, and the camera sampling rate and light source intensities may be determined individually for each layer.

It is been discovered that once the light source intensity and camera sampling rates have been optimized, the resulting time series of light intensity measurements not only produce clean traces as illustrated in FIG. 7, but also produces traces that are very repeatable. This allows the endpoint calculation to be determined using as few as a single trace for each material layer. This effectively eliminates or greatly reduces the need for the repeatability algorithm 326 illustrated in FIG. 3, which typically destroys at least 10 wafers for each layer. For example, a single wafer may be etched through both the first layer and the second layer to capture the traces 702, 752. The endpoint determination algorithm may then set the endpoint between time 704 and time 706 for the first layer, and may then set the endpoint between time 754 and 756 for the second layer after identifying the minimum values in the traces 702, 752. Thus, the entire process for determining endpoints for any number of layers may only require the destruction of a single wafer, and may only require a single full execution of the semiconductor process.

Figure 8:
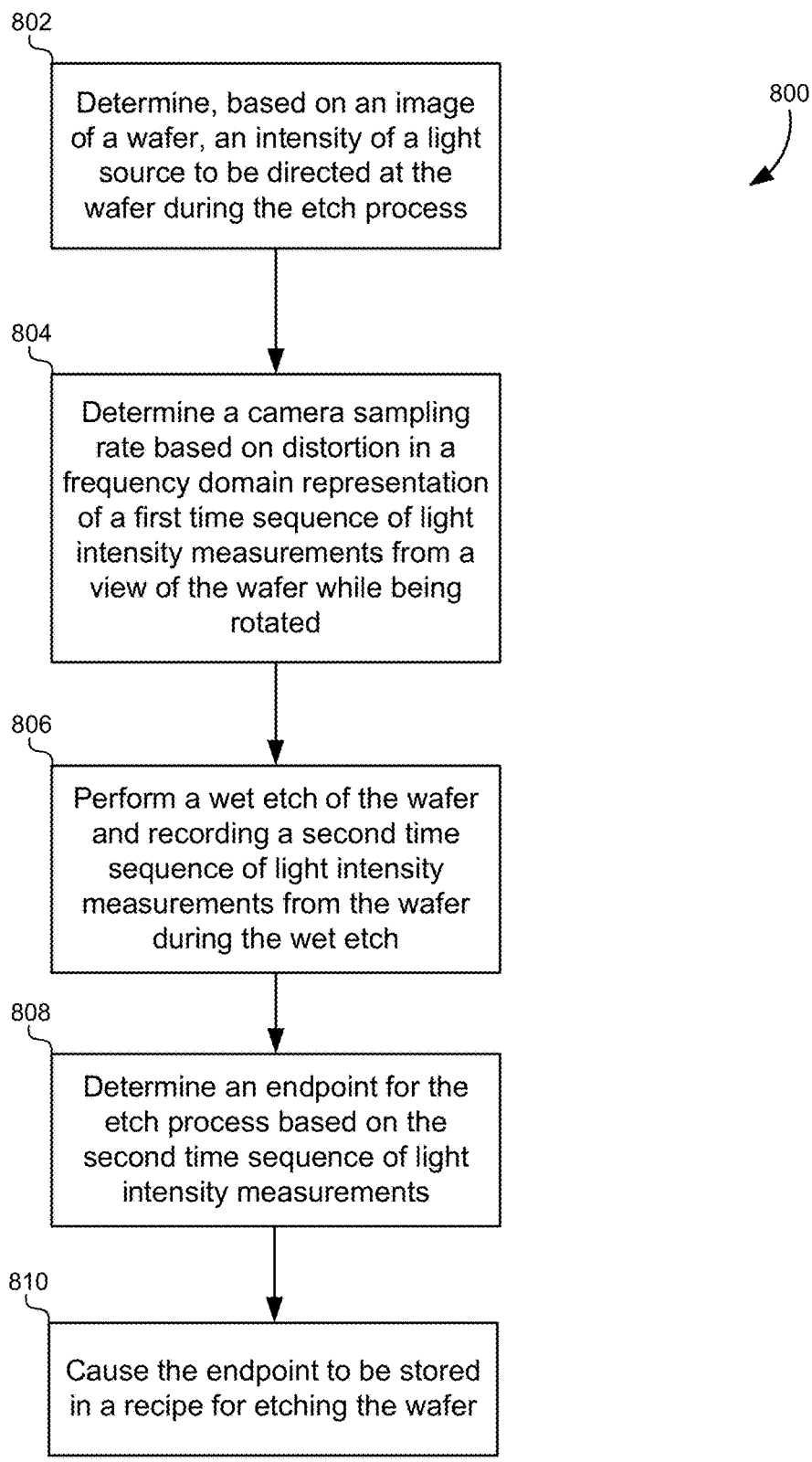
FIG. 8 illustrates a method of determining endpoints for semiconductor processes, according to some embodiments.

FIG. 8 illustrates a method of determining endpoints for semiconductor processes, according to some embodiments. This method may be executed by a computer system or chamber controller, such as the computer system described below in FIG. 10. Each of these method steps may be represented as instructions stored on a non-transitory computer-readable medium and executed by one or more processors. These operations may be carried out as described in detail above in FIGS. 5-8.

The method may include determining, based on an image of a wafer, an intensity of a light source to be directed at the wafer during the semiconductor process (802). Determining the intensity of the light source may be executed as described below in FIG. 9A. The method may also include determining a camera sampling rate based on a distortion in a frequency domain representation of a first time sequence of light intensity measurements from a view of the wafer while being rotated (804). Determining the camera sampling rate may be executed as described below in FIG. 9B.

The method may additionally include performing a semiconductor process on the wafer and recording a second time sequence of light intensity measurements from the wafer during an actual execution of the semiconductor process on the wafer (806). As illustrated above in FIG. 8, a second time sequence of light intensity measurements may be acquired for each material layer that will be subjected to the semiconductor process. For example, traces may be acquired for each of multiple layers being removed in a wet etch chamber. The second time sequence of light intensity measurements may be acquired using the camera, light source, and monitoring system of the semiconductor chamber, and these devices may operate using to the optimized camera sampling rate and light source intensity stored as part of a recipe for the wafer.

The method may further include determining an endpoint for the semiconductor process based on the second time sequence of light intensity measurements (808). As described above, the endpoint determination algorithm may identify a minimum/maximum in the resulting trace as the material is removed or added on the surface of the wafer. The endpoint may be set at this minimum/maximum value, or may be set to a time after the endpoint has been reached to ensure that all material has been removed or added on the surface of the wafer. Note that these traces generated by the second time sequence of light intensity measurements are sufficient to generate the endpoint without requiring additional traces to verify the repeatability of the trace. Thus, this process may require the destruction of only one wafer. (Other embodiments may perform additional test processes on additional wafers in order to verify that these traces are repeatable if required.)

The method may also include causing the endpoint to be stored in a recipe for processing the wafer (810). The endpoint determination may now be considered valid for this wafer pattern. This allows a batch of wafers using this pattern to be processed using the same recipe with the same camera sampling rate and light intensity settings.

It should be appreciated that the specific steps illustrated in FIG. 8 provide particular methods of determining endpoints for semiconductor processes according to various embodiments. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 9:
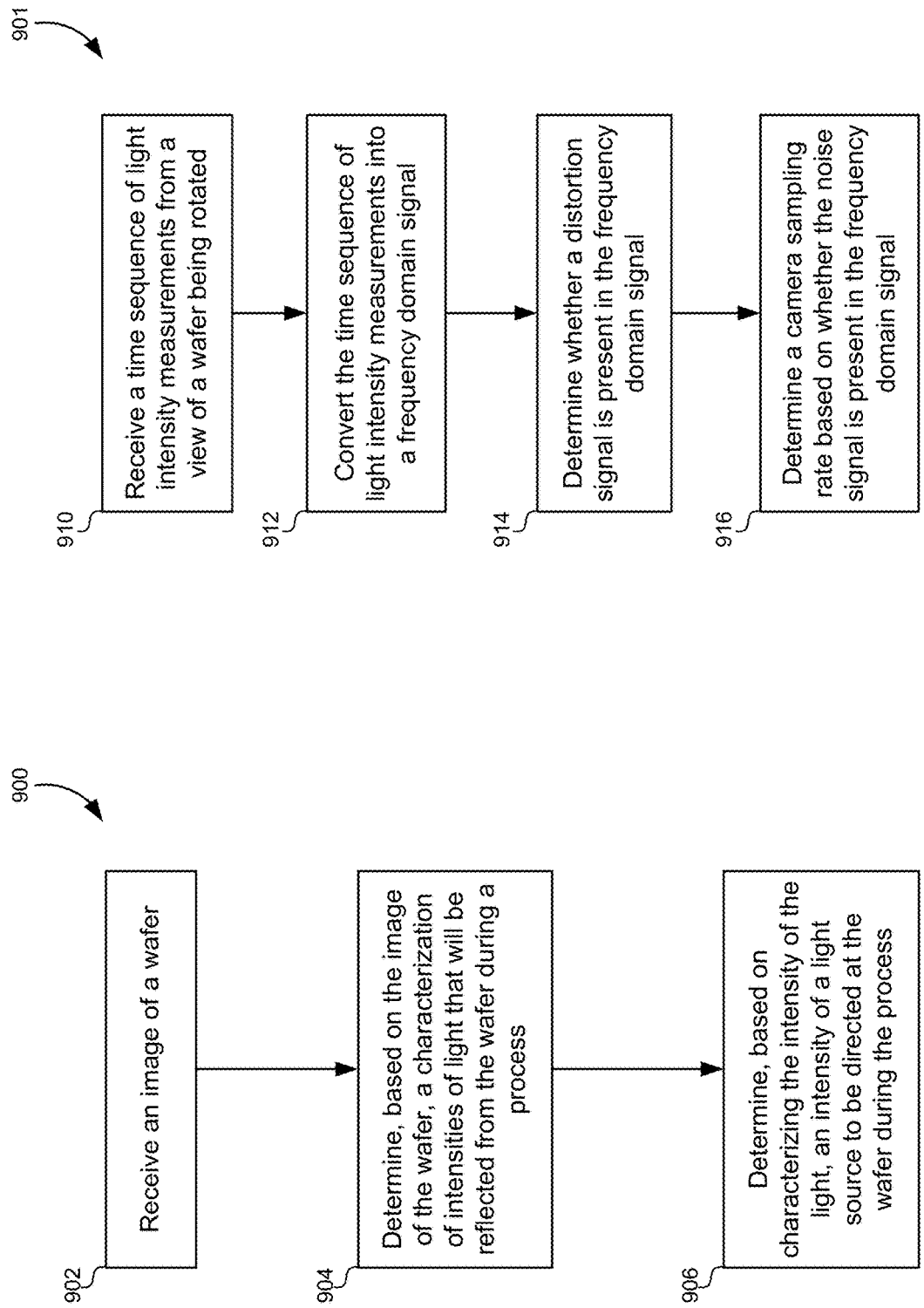
FIG. 9A illustrates a flowchart of a method of optimizing light sources used to monitor semiconductor processes, according to some embodiments.
FIG. 9B illustrates a flowchart of a method of optimizing camera sampling rates used to monitor semiconductor processes, according to some embodiments.

FIG. 9A illustrates a flowchart 900 of a method of optimizing light sources used to monitor semiconductor processes, according to some embodiments. This method may be executed by a computer system or chamber controller, such as the computer system described below in FIG. 10. Each of these method steps may be represented as instructions stored on a non-transitory computer-readable medium and executed by one or more processors. These operations may be carried out as described in detail above in FIGS. 5A-5C.

The method may include receiving an image of a wafer (902). The image of the wafer may include an image captured outside of a semiconductor processing chamber while the wafer is still and before the wafer is submerged in a processing liquid. The image may also be captured inside of a semiconductor processing chamber while the wafer is rotated and before the wafer is submerged in a processing liquid. The image of the wafer may be converted into a grayscale image, and pixel values in the grayscale image may characterize intensities of light that may be reflected from corresponding locations on the wafer during the semiconductor process.

The method may also include determining a characterization of intensities of light that will be reflected from the wafer during a semiconductor process (904). The characterization of the intensities of light may be stored as a histogram of pixel values from the image of the wafer. The histogram may include a peak location or average value that characterizes the overall light intensity reflected off the image as a whole. In some embodiments, characterizing the intensities of light may include providing the image of the wafer, the histogram, or other data associated with the image as an input to a trained machine-learning model. The intensities of light may also be characterized by comparing a peak or average value to a threshold or acceptable range that will generate a clean repeatable trace.

The method may further include determining an intensity of a light source to be directed at the wafer during a semiconductor process (906). The intensity of the light source may be determined based on the characterization of the intensity of light in the image. For example, light intensities in the image above a threshold may be translated into a reduction in the intensity of the light source in the chamber. Light intensities in the image below a threshold may be translated into an increase in the intensity of the light source in the chamber. Some embodiments may iteratively increase or decrease pixel values in the image of the wafer corresponding to an increase or decrease in the intensity of the light source until the characterization of the intensities of light that will be reflected is in a range that will produce a clean and repeatable trace. Some embodiments may receive an output from the model used to determine the intensity of the light source. The intensity of the light source may be stored as a recipe parameter for a semiconductor process, such as an etch process, and the etch process may be executed on a wafer using the recipe parameter to control the intensity of the light source during the process.

It should be appreciated that the specific steps illustrated in FIG. 9A provide particular methods of optimizing light sources used to monitor semiconductor processes according to various embodiments. Other sequences of steps may also be performed according to alternative embodiments. For example, alternative embodiments may perform the steps outlined above in a different order. Moreover, the individual steps illustrated in FIG. 9A may include multiple sub-steps that may be performed in various sequences as appropriate to the individual step. Furthermore, additional steps may be added or removed depending on the particular applications. Many variations, modifications, and alternatives also fall within the scope of this disclosure.

FIG. 9B illustrates a flowchart 901 of a method of optimizing camera sampling rates used to monitor semiconductor processes, according to some embodiments. This method may be executed by a computer system or chamber controller, such as the computer system described below in FIG. 10. Each of these method steps may be represented as instructions stored on a non-transitory computer-readable medium and executed by one or more processors. These operations may be carried out as described in detail above in FIGS. 6A-6C.

The method may include receiving a time sequence of light intensity measurements from a view of a wafer being rotated (910). The view of the wafer may include a camera view of the wafer as the wafer is rotated in the semiconductor processing chamber. The wafer may be rotated and the data may be captured before the wafer is submerged in a processing liquid such that the time sequence of light intensities may be captured without destroying or altering the surface of the wafer. The view of the wafer may be captured using a camera that is part of the monitoring system that is used to monitor the endpoint progress during a live semiconductor process, such as an etch process. Alternatively, the view of the wafer may use a static image of the wafer, which may be captured inside or outside of the semiconductor processing chamber. This image may be virtually rotated in software and sampled using a virtual camera that is configured to capture a time sequence of light intensity measurements in the same manner as the physical camera in the monitoring system. For example, an image used to optimize the intensity of the light source as described above may also be used to optimize the camera sampling rate.

The method may also include converting the time sequence of light intensity measurements into a frequency domain signal (912). For example, a digital Fourier transform or an FFT algorithm may be performed on the time sequence of light intensity measurements to convert these measurements into the frequency domain.

The method may additionally include determining whether a distortion signal is present in the frequency domain signal (914). A distortion signal may be detected as a spike, peak, or other anomaly in the frequency domain signal. As illustrated in FIGS. 6A-6C, the frequency domain signal may include a regular pattern of peaks or spikes that may be ignored to identify an irregular spike in the frequency domain signal.

The method may further include determining a camera sampling rate based on whether the distortion signal is present in the frequency domain signal (916). In some embodiments, the location and/or magnitude of the distortion signal may be provided to a lookup table to retrieve a predetermined camera sampling rate that will sufficiently remove the distortion signal. In some embodiments, the frequency domain signal may be provided to a machine learning process that uses a trained neural network to analyze the frequency domain signal and output a value that may be used to scale the sampling rate of the camera (e.g., a value between 0.0 and 1.0). In some embodiments, an iterative method may be used where the camera sampling rate is incrementally increased until the distortion signal is no longer present in the frequency domain signal. The iterative method may also be used to iteratively decrease the camera sampling rate until the distortion signal becomes present in the frequency domain signal, then increasing the sampling rate just enough to remove the distortion signal. This iterative process may repeatedly adjust the camera sampling rate and receive a new time sequence of light intensity measurements after adjusting the sampling rate using the nondestructive or virtual process described above.

It should be appreciated that the specific steps illustrated in FIG. 9B provide particular methods of optimizing camera sampling rates used to monitor semiconductor processes according to various embodiments. Other sequences of steps may also be performed according to alternative embodiments. For example, alternative embodiments may perform the steps outlined above in a different order. Moreover, the individual steps illustrated in FIG. 9B may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 10:
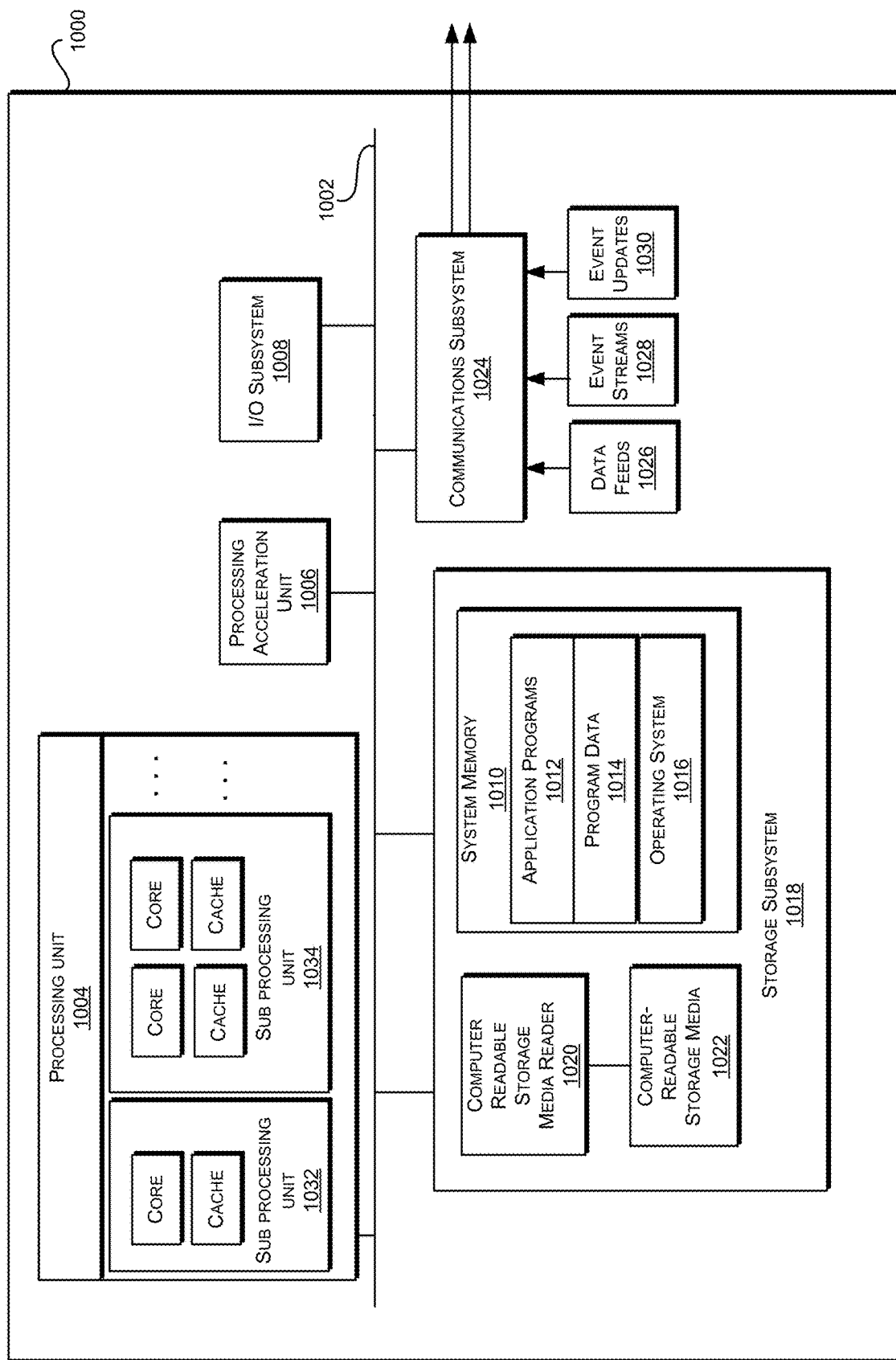
FIG. 10 illustrates an exemplary computer system, in which various embodiments may be implemented.

FIG. 10 illustrates an exemplary computer system 1000, in which various embodiments may be implemented. The system 1000 may be used to implement any of the computer systems described above. For example, the system 1000 may be used to implement a controller for the camera monitoring system in a semiconductor processing chamber. The system 1000 may also be used to optimize the camera sampling rate and light source intensity, and may then provide the settings to a recipe to be executed by the semiconductor processing system. As shown in the figure, computer system 1000 includes a processing unit 1004 that communicates with a number of peripheral subsystems via a bus subsystem 1002. These peripheral subsystems may include a processing acceleration unit 1006, an I/O subsystem 1008, a storage subsystem 1018 and a communications subsystem 1024. Storage subsystem 1018 includes tangible computer-readable storage media 1022 and a system memory 1010.

Bus subsystem 1002 provides a mechanism for letting the various components and subsystems of computer system 1000 communicate with each other as intended. Although bus subsystem 1002 is shown schematically as a single bus, alternative embodiments of the bus subsystem may utilize multiple buses. Bus subsystem 1002 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1004, which can be implemented as one or more integrated circuits (e.g., a conventional microprocessor or microcontroller), controls the operation of computer system 1000. One or more processors may be included in processing unit 1004. These processors may include single core or multicore processors. In certain embodiments, processing unit 1004 may be implemented as one or more independent processing units 1032 and/or 1034 with single or multicore processors included in each processing unit. In other embodiments, processing unit 1004 may also be implemented as a quad-core processing unit formed by integrating two dual-core processors into a single chip.

In various embodiments, processing unit 1004 can execute a variety of programs in response to program code and can maintain multiple concurrently executing programs or processes. At any given time, some or all of the program code to be executed can be resident in processor(s) 1004 and/or in storage subsystem 1018. Through suitable programming, processor(s) 1004 can provide various functionalities described above. Computer system 1000 may additionally include a processing acceleration unit 1006, which can include a digital signal processor (DSP), a special-purpose processor, and/or the like.

I/O subsystem 1008 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1000 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1000 may comprise a storage subsystem 1018 that comprises software elements, shown as being currently located within a system memory 1010. System memory 1010 may store program instructions that are loadable and executable on processing unit 1004, as well as data generated during the execution of these programs.

Depending on the configuration and type of computer system 1000, system memory 1010 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1004. In some implementations, system memory 1010 may include multiple different types of memory, such as static random access memory (SRAM) or dynamic random access memory (DRAM). In some implementations, a basic input/output system (BIOS), containing the basic routines that help to transfer information between elements within computer system 1000, such as during start-up, may typically be stored in the ROM. By way of example, and not limitation, system memory 1010 also illustrates application programs 1012, which may include client applications, Web browsers, mid-tier applications, relational database management systems (RDBMS), etc., program data 1014, and an operating system 1016. By way of example, operating system 1016 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1018 may also provide a tangible computer-readable storage medium for storing the basic programming and data constructs that provide the functionality of some embodiments. Software (programs, code modules, instructions) that when executed by a processor provide the functionality described above may be stored in storage subsystem 1018. These software modules or instructions may be executed by processing unit 1004. Storage subsystem 1018 may also provide a repository for storing data used in accordance with some embodiments.

Storage subsystem 1000 may also include a computer-readable storage media reader 1020 that can further be connected to computer-readable storage media 1022. Together and, optionally, in combination with system memory 1010, computer-readable storage media 1022 may comprehensively represent remote, local, fixed, and/or removable storage devices plus storage media for temporarily and/or more permanently containing, storing, transmitting, and retrieving computer-readable information.

Computer-readable storage media 1022 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1000.

By way of example, computer-readable storage media 1022 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1022 may include, but is not limited to, Zip® drives, flash memory cards, universal serial bus (USB) flash drives, secure digital (SD) cards, DVD disks, digital video tape, and the like. Computer-readable storage media 1022 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1000.

Communications subsystem 1024 provides an interface to other computer systems and networks. Communications subsystem 1024 serves as an interface for receiving data from and transmitting data to other systems from computer system 1000. For example, communications subsystem 1024 may enable computer system 1000 to connect to one or more devices via the Internet. In some embodiments communications subsystem 1024 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1024 can provide wired network connectivity (e.g., Ethernet) in addition to or instead of a wireless interface.

In some embodiments, communications subsystem 1024 may also receive input communication in the form of structured and/or unstructured data feeds 1026, event streams 1028, event updates 1030, and the like on behalf of one or more users who may use computer system 1000.

By way of example, communications subsystem 1024 may be configured to receive data feeds 1026 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1024 may also be configured to receive data in the form of continuous data streams, which may include event streams 1028 of real-time events and/or event updates 1030, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1024 may also be configured to output the structured and/or unstructured data feeds 1026, event streams 1028, event updates 1030, and the like to one or more databases that may be in communication with one or more streaming data source computers coupled to computer system 1000.

Computer system 1000 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of optimizing light sources used to monitor semiconductor processes, the method comprising:
   receiving an image of a wafer;
   determining, based on the image of the wafer, a characterization of intensities of light that will be reflected from the wafer during a semiconductor process; and
   determining, based on characterizing the intensity of the light, an intensity of a light source to be directed at the wafer during a semiconductor process.

2. The method of claim 1, wherein the image of the wafer comprises an image captured outside of a semiconductor processing chamber while the wafer is still and before the wafer is subjected to an etch process.

3. The method of claim 1, wherein the image of the wafer comprises a grayscale image, and pixel values in the grayscale image characterize intensities of light that will be reflected from corresponding locations on the wafer during the semiconductor process.

4. The method of claim 1, storing the intensity of the light source as a recipe parameter for the semiconductor process, and executing the semiconductor process on the wafer using the recipe parameter to control the intensity of the light source during the semiconductor process.

5. The method of claim 1, wherein the image of the wafer comprises an image captured inside of a semiconductor processing chamber while the wafer is rotated and before the wafer is subjected to an etch process.

6. The method of claim 1, wherein:
   determining the characterization of the intensities of light comprises: providing the image of the wafer or the characterization of intensities of light as an input to a model; and
   determining the intensity of the light source to be directed at the wafer during a semiconductor process comprises: receiving an output from the model used to determine the intensity of the light source.

7. The method of claim 1, wherein the characterization of intensities of light comprises a histogram of pixel values in the image of the wafer.

8. The method of claim 1, wherein determining the intensity of the light source to be directed at the wafer during a semiconductor process comprises:
   iteratively increasing or decreasing pixel values in the image of the wafer corresponding to an increase or decrease in the intensity of the light source until the characterization of the intensities of light that will be reflected is in a range that will produce a clean and repeatable trace.

9. A method of optimizing camera sampling rates used to monitor semiconductor processes, the method comprising:
   receiving a time sequence of light intensity measurements from a view of a wafer being rotated;
   converting the time sequence of light intensity measurements into a frequency domain signal;
   determining whether a distortion signal is present in the frequency domain signal; and
   determining a camera sampling rate based on whether the distortion signal is present in the frequency domain signal.

10. The method of claim 9, wherein the view of the wafer comprises a camera view of the wafer as the wafer is rotated in a semiconductor processing chamber while the wafer before the wafer is subjected to an etch process.

11. The method of claim 9, wherein the view of the wafer comprises a virtual rotation of an image of the wafer.

12. The method of claim 9, wherein determining the camera sampling rate based on whether the distortion signal is present in the frequency domain signal comprises:
   determining that the distortion signal is present in the frequency domain signal; and
   increasing the camera sampling rate relative to a camera sampling rate used to capture the time sequence of light intensity measurements.

13. The method of claim 12, further comprising:
   iteratively increasing the camera sampling rate, and receiving a new time sequence of light intensity measurements after increasing the sampling rate until the distortion signal is no longer present in the frequency domain signal.

14. The method of claim 9, wherein determining the camera sampling rate based on whether the distortion signal is present in the frequency domain signal comprises:
 determining that the distortion signal is not present in the frequency domain signal; and
 decreasing the camera sampling rate relative to a camera sampling rate used to capture the time sequence of light intensity measurements.

15. The method of claim 14, further comprising:
 iteratively decreasing the camera sampling rate, and receiving a new time sequence of light intensity measurements after decreasing the sampling rate until the distortion signal is present in the frequency domain signal, then increasing the sampling rate enough to remove the distortion signal.

16. The method of claim 9, further comprising storing the camera sampling rate as a recipe parameter for the semiconductor process, and executing the semiconductor process on the wafer using the recipe parameter to control the camera sampling rate during the semiconductor process.

17. A method of determining endpoints for semiconductor processes, the method comprising:
 determining, based on an image of a wafer, an intensity of a light source to be directed at the wafer during a semiconductor process;
 determining a camera sampling rate based on distortion in a frequency domain representation of a first time sequence of light intensity measurements from a view of the wafer while being rotated;
 performing the semiconductor process on the wafer and recording a second time sequence of light intensity measurements from the wafer during an actual execution of the semiconductor process on the wafer;
 determining an endpoint for the semiconductor process based on the second time sequence of light intensity measurements; and
 causing the endpoint to be stored in a recipe for processing the wafer.

18. The method of claim 17, wherein:
 determining the intensity of the light source comprises:
  receiving the image of a wafer;
  determining, based on the image of the wafer, a characterization of intensities of light that will be reflected from the wafer during a semiconductor process; and
  determining, based on characterizing the intensity of the light, the intensity of the light source to be directed at the wafer during a semiconductor process; and
 determining the camera sampling rate comprises:
  receiving a time sequence of light intensity measurements from a view of a wafer being rotated;
  converting the time sequence of light intensity measurements into a frequency domain signal;
  determining whether a distortion signal is present in the frequency domain signal; and
  determining the camera sampling rate based on whether the distortion signal is present in the frequency domain signal.

19. The method of claim 17, wherein the second time sequence of light intensity measurements for the etch process is sufficient to generate the endpoint as a repeatable trace without requiring destruction of more than one wafer.

20. The method of claim 17, further comprising:
 executing the semiconductor process on the wafer using the recipe to control the camera sampling rate during the semiconductor process and using the recipe to control the intensity of the light source during the semiconductor process.

* * * * *